United States Patent
Li et al.

(10) Patent No.: US 10,636,496 B2
(45) Date of Patent: Apr. 28, 2020

(54) MEMORY DEVICE WITH PROGRAMMING CYCLE STAGES

(71) Applicant: Macronix International Co., Ltd., Hsinchu (TW)

(72) Inventors: Chia-Ching Li, Hsinchu (TW); Yi-Ching Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 19 days.

(21) Appl. No.: 15/917,037

(22) Filed: Mar. 9, 2018

(65) Prior Publication Data

US 2019/0279726 A1 Sep. 12, 2019

(51) Int. Cl.
| G11C 16/04 | (2006.01) |
| G06F 12/02 | (2006.01) |
| G11C 16/28 | (2006.01) |
| G11C 11/4099 | (2006.01) |
| G11C 11/408 | (2006.01) |

(52) U.S. Cl.
CPC .......... G11C 16/28 (2013.01); G06F 12/0246 (2013.01); G11C 11/4085 (2013.01); G11C 11/4099 (2013.01); G11C 16/0483 (2013.01)

(58) Field of Classification Search
CPC . G11C 16/28; G11C 16/0483; G11C 16/3418; G11C 16/3422; G11C 16/3427; G11C 16/3431; G11C 11/4085; G11C 11/4099; G06F 12/0246
See application file for complete search history.

(56) References Cited

U.S. PATENT DOCUMENTS

| 8,289,774 B2 | 10/2012 | Moon et al. |
| 8,385,115 B2 | 2/2013 | Lee et al. |
| 9,171,627 B2 | 10/2015 | Lee et al. |
| 9,564,223 B2 | 2/2017 | Jung |
| 9,691,490 B2 | 6/2017 | Choi et al. |
| 2015/0221385 A1* | 8/2015 | Ahn ........................ G11C 16/10 365/185.2 |
| 2015/0294726 A1* | 10/2015 | Sim .................... G11C 16/0483 365/185.12 |

* cited by examiner

*Primary Examiner* — Sultana Begum
(74) *Attorney, Agent, or Firm* — Fish & Richardson P.C.

(57) ABSTRACT

A memory device comprising: a memory cell array and a memory controller configured to program data to memory cells during a programming cycle using operations comprising: during a setup stage, providing a first voltage level to word lines, a second voltage level to a first dummy word line, and a fourth voltage level to second dummy word lines being different from the first dummy word line, wherein the first voltage level is lower than a threshold voltage of a first transistor coupled to the first dummy word line and the second voltage level and the fourth voltage are higher than the threshold voltage, during a program stage, providing a third voltage level to first word lines to program data to memory cells coupled to the first word lines, the second voltage level to the first dummy word line, and the fourth voltage level to the second dummy word lines.

20 Claims, 7 Drawing Sheets

MEMORY DEVICE WITH PROGRAMMING CYCLE STAGES

TECHNICAL FIELD

The present application relates to a memory device. In particular, the present application relates to programming data to memory cells in a memory device.

BACKGROUND

Memory cells can be programmed by applying a set of voltages during a programming cycle. In particular, to program data to a high-density memory device, e.g., a high-density NAND flash memory device, different levels of voltages can be applied to the high-density memory device at different timings for suitable periods.

SUMMARY

The present application describes techniques to program data to memory cells in a memory device. In particular, where the memory device includes one or more word lines and one or more dummy word lines, hot carriers can occur in a border area between the dummy word lines and the word lines. These hot carriers can cause a programming disturbance in a transistor located in the border area. For example, hot carriers can cause electrical coupling between a gate of a transistor in the border area and a drain of the transistor. If the gate of the transistor is electrically coupled to the drain of the transistor, the transistor cannot be controlled by a voltage applied to the gate of the transistor. Thus, one or more memory cells coupled to the transistor cannot be correctly programmed.

The techniques disclosed in the present application can prevent or reduce program disturbance by reducing or eliminating hot carriers in the border area. In particular, by applying different levels of voltages at appropriate timings for suitable periods, hot carriers can be reduced or eliminated in the border area such that it prevents program disturbance. As a result, the techniques can reduce an error rate for programming data to a memory device, thus improving the efficiency of the memory device.

In general, one innovative aspect of the subject matter described in this specification can be implemented in a memory device comprising: a memory controller; and a memory cell array that includes one or more memory blocks, wherein each memory block of the one or more memory blocks includes one or more strings, each string of the one or more strings comprising: a plurality of dummy word lines, a plurality of word lines, and a plurality of memory cells respectively coupled to the plurality of word lines, wherein the memory controller is configured to program one or more data to one or more memory cells of the plurality of memory cells using operations during a programming cycle, the operations comprising: during a setup stage of the programming cycle, providing a first voltage level to the plurality of word lines, providing a second voltage level to a first dummy word line of the plurality of dummy word lines, and providing a fourth voltage level to second dummy word lines of the plurality of dummy word lines, the second dummy word lines being different from the first dummy word line, wherein (i) the first voltage level is lower than a threshold voltage of a first transistor coupled to the first dummy word line and (ii) the second voltage level and the fourth voltage are higher than the threshold voltage of the first transistor, during a program stage of the programming cycle, providing a third voltage level to one or more first word lines of the plurality of word lines to program one or more data to one or more memory cells coupled to the one or more first word lines, providing the second voltage level to the first dummy word line of the plurality of dummy word lines, and providing the fourth voltage level to the second dummy word lines of the plurality of dummy word lines.

The foregoing and other implementations can each optionally include one or more of the following features, alone or in combination. In particular, one implementation includes all the following features in combination. The operations further comprises: during the program stage of the programming cycle, providing a fifth voltage level to one or more second word lines of the plurality of word lines to maintain one or more data stored in one or more memory cells coupled to the one or more second word lines. The first dummy word line is a dummy word line from the plurality of dummy word lines that is closest to the plurality of word lines. The setup stage of the programming cycle continues for 1-10 μs. The program stage of the programming cycle continues for 10-100 μs. The third voltage level is between 13 and 25V and the fifth voltage level is between 6 and 10V. The second voltage level is between 6 and 10V. The second voltage level is the same as the fifth voltage level. The second voltage level is different from the fifth voltage level that is higher than the threshold voltage.

In general, another innovative aspect of the subject matter described in this specification can be implemented in a method for programming, during a programming cycle, one or more data to a memory cell array that includes one or more memory blocks, wherein each memory block of the one or more memory blocks includes one or more strings, each string of the one or more strings comprising: a plurality of dummy word lines, a plurality of word lines, and a plurality of memory cells respectively coupled to the plurality of word lines, wherein the method comprises: during a setup stage of the programming cycle, providing a first voltage level to the plurality of word lines, providing a second voltage level to a first dummy word line of the plurality of dummy word lines, and providing a fourth voltage level to second dummy word lines of the plurality of dummy word lines, the second dummy word lines being different from the first dummy word line, wherein (i) the first voltage level is lower than a threshold voltage of a first transistor coupled to the first dummy word line and (ii) the second voltage level and the fourth voltage level are higher than the threshold voltage of the first transistor, during a program stage of the programming cycle, providing a third voltage level to one or more first word lines of the plurality of word lines to program one or more data to one or more memory cells coupled to the one or more first word lines, providing the second voltage level to the first dummy word line of the plurality of dummy word lines, and providing the fourth voltage level to the second dummy word lines.

The foregoing and other implementations can each optionally include one or more of the following features, alone or in combination. In particular, one implementation includes all the following features in combination. The method further includes: during the program stage of the programming cycle, providing a fifth voltage level to one or more second word lines of the plurality of word lines to maintain one or more data stored in one or more memory cells coupled to the one or more second word lines. The first dummy word line is a dummy word line from the plurality of dummy word lines that is closest to the plurality of word lines. The setup stage of the programming cycle continues for 1-10 μs. The program state of the programming cycle continues for 10-100 μs. The third voltage level is between 13 and 25V and the fifth voltage level is between 6 and 10V. The second voltage level is between 6 and 10V. The second voltage level is the same as the fifth voltage level. The second voltage level is different from the fifth voltage level that is higher than the threshold voltage.

In general, another innovative aspect of the subject matter described in this specification can be implemented in a memory device comprising: a memory controller; and a memory cell array that includes one or more memory blocks, wherein each memory block of the one or more memory blocks includes one or more strings, each string of the one or more strings comprising: a plurality of dummy word lines, a plurality of word lines, and a plurality of memory cells respectively coupled to the plurality of word lines, wherein the memory controller is configured to program one or more data to one or more memory cells of the plurality of memory cells using operations during a programming cycle, the operations comprising: during a setup stage of the programming cycle, providing a first voltage level to the plurality of word lines, providing a second voltage level to a first dummy word line of the plurality of dummy word lines, and providing a fourth voltage level to second dummy word lines of the plurality of dummy word lines, the second dummy word lines being different from the first dummy word line, wherein (i) the first voltage level is lower than a threshold voltage of a first transistor coupled to the first dummy word line and (ii) the second voltage level and the fourth voltage level are higher than the threshold voltage of the first transistor, during a program stage of the programming cycle, providing a third voltage level to one or more first word lines of the plurality of word lines to program one or more data to one or more memory cells coupled to the one or more first word lines, and providing a fifth voltage level to the first dummy word line of the plurality of dummy word lines, and providing the fourth voltage level to the second dummy word lines, wherein the fifth voltage level is higher than the second voltage level.

The foregoing and other implementations can each optionally include one or more of the following features, alone or in combination. In particular, one implementation includes all the following features in combination. The first dummy word line is a dummy word line from the plurality of dummy word lines that is closest to the plurality of word lines.

The details of one or more examples of the subject matter described in this specification are set forth in the accompanying drawings and the description below. Other potential features, aspects, and advantages of the subject matter will become apparent from the description, the drawings, and the claim.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

A memory cell in a memory device can be programmed, e.g., data can be written to, read from, or erased from the memory cell, by applying different voltage levels to the memory cell at different timings for suitable periods during a programming cycle.

Figure 1:
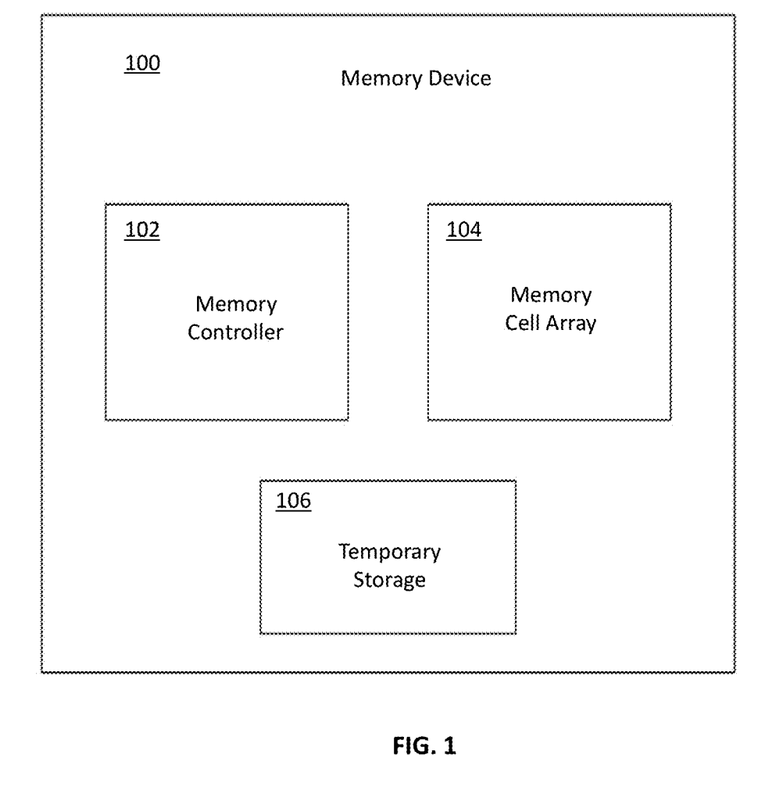
FIG. 1 illustrates an example memory device.

FIG. 1 illustrates an example memory device 100. The memory device 100 includes a memory controller 102 and a memory cell array 104. The memory controller 102 includes hardware and software logic to perform various operations, which include programming the memory array 104, e.g., writing to, reading from, or erasing from the memory array 104. In some implementations, the memory controller 102 includes one or more processors to program memory cells in the memory cell array 104. For example, the memory controller 102 can execute operations to program the memory array 104. The operations can be stored in a storage accessible by the memory controller 102. In some implementations, the operations can be stored at a flash memory or a hard disk. In some implementations, the operations can be stored at a temporary storage. In some implementations, the operations can be stored in a dedicated portion of the memory array 104 that is distinct from the memory cells that are to be programmed.

The memory array 104 includes one or more memory blocks. In some implementations, each of the memory blocks may include a plurality of strings. A string can include a plurality of memory cells. The memory cells can be single-level cells or multi-level cells. In some implementations, the memory array 104 includes nonvolatile memory cells, e.g., a flash memory cells. However, the memory array 104 can include any type of memory cells including, but not limited to, 2D NAND flash memory cells, 3D NAND flash memory cells comprising U-shaped strings, and 3D NAND flash memory cells comprising non-U-shaped strings. In some implementations, each of the memory blocks may include a single string.

In some implementations, the memory device 100 can further include a temporary storage 106 to store information for programming memory cells in the memory cell array 104. The information can include different voltages levels, timing data to define the times during which the different voltage levels are applied to the memory cell array. A variety of formats are possible for the timing data for the different voltage levels are applied to the memory cell array, e.g., a start time and an end time for a particular voltage level, or a start time and a durations for the particular voltage level. The temporary storage 106 can be any type of suitable storage. For example, the temporary storage 106 can be static random access memory (SRAM), NAND flash memory, or a set of registers. In some implementations, the temporary storage 106 can be implemented as a portion of the memory array 104, which can be distinct from the memory cells that are to be programmed.

Figure 2:
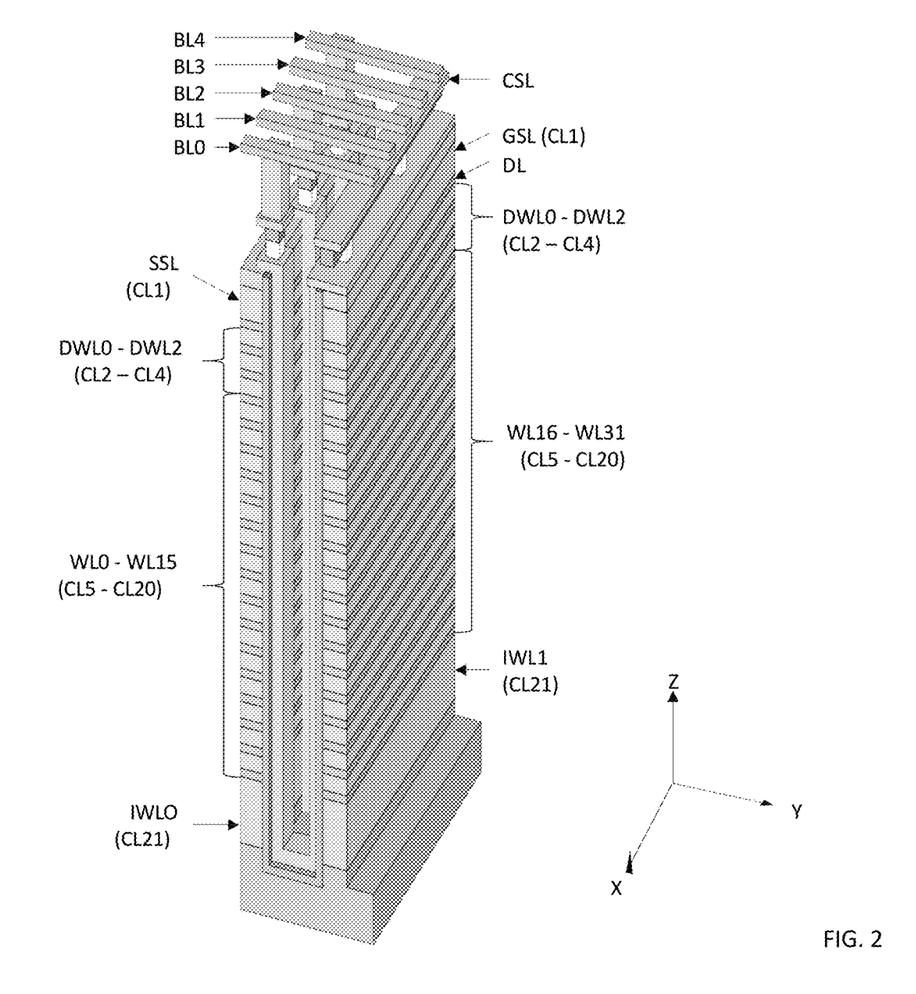
FIG. 2 illustrates an example structure of memory cell array.

FIG. 2 illustrates an example structure of a memory cell array, in particular, a memory cell of a 3D NAND structure. For example, the memory cell array can be the memory cell array 104 described with reference to FIG. 1. The structure illustrated in FIG. 2 is a portion of the structure of the memory cell. The memory cell array includes a multilayer lamination of conductive layers, e.g., metal layers or polysilicon layers. For example, the memory cell array includes M (where M is an integer>0) layers of circuitry, with each layer of circuitry provided by a different conductive layer. The memory cell array can include array layers and peripheral layers.

In some implementations, the array layers include conductive layers having twenty-one layers, e.g., conductive layers CL1-CL21, of circuitry. For example, the conductive layer CL1 includes a string select line SSL and a ground select line GSL, the conductive layers CL2-CL4 respectively include a plurality of dummy word lines DWL0-DWL2, the conductive layers CL5-CL20 respectively include a plurality of word lines WL0-31, and the conductive layer CL21 includes a plurality of inversion word lines IWL0-IWL1.

In some implementations, the peripheral layers include metal layers having four layers, e.g., four metal layers, of circuitry. For example, a common source line CSL is connected by a fourth metal layer through a first metal layer to peripheral circuit. The string select line SSL, the dummy word lines DWL0-DWL2, the word lines WL0-WL31, and the inversion word lines IWL0-IWL1 are connected by a third metal layer through polysilicon to the peripheral circuit. The bit lines BL0-BL4 are connected by a second metal layer to the peripheral circuit. In some implementations, the peripheral circuit includes High-Voltage (HV) circuit, one or more row decoders, and one or more column decoders. In some implementations, the peripheral circuit can be located inside the memory cell array 104.

However, the number of layers of circuitry is not limited to a particular number. The memory cell array can include any suitable number of layers of circuitry in various implementations. In addition, although a U-shaped 3D NAND flash memory cell is illustrated, the techniques are applicable to other types of memory cells, e.g., a 2D NAND flash memory cell or a non-U-shape 3D NAND flash memory cell.

In some implementations, one or more bit lines are coupled to a first metal line, one or more common source lines are coupled to a second metal line. In addition, one or more string select lines, one or more dummy word lines, one or more word lines, and one or more inversion word lines are coupled to a third metal line.

In some implementations, one or more dielectric layers is provided between two adjacent conductive layers of the multilayer lamination to electrically insulate those conductive layers each other. For example, in FIG. 2, a dielectric layer DL is provided between the conductive layer CL1 and the conductive layer CL2. In some implementations, a dielectric layer does not exist between two adjacent conductive layers of the multiplayer lamination. In these implementations, any suitable technique can be used to insulate two adjacent conductive layers of the multilayer lamination each other.

Figure 3:
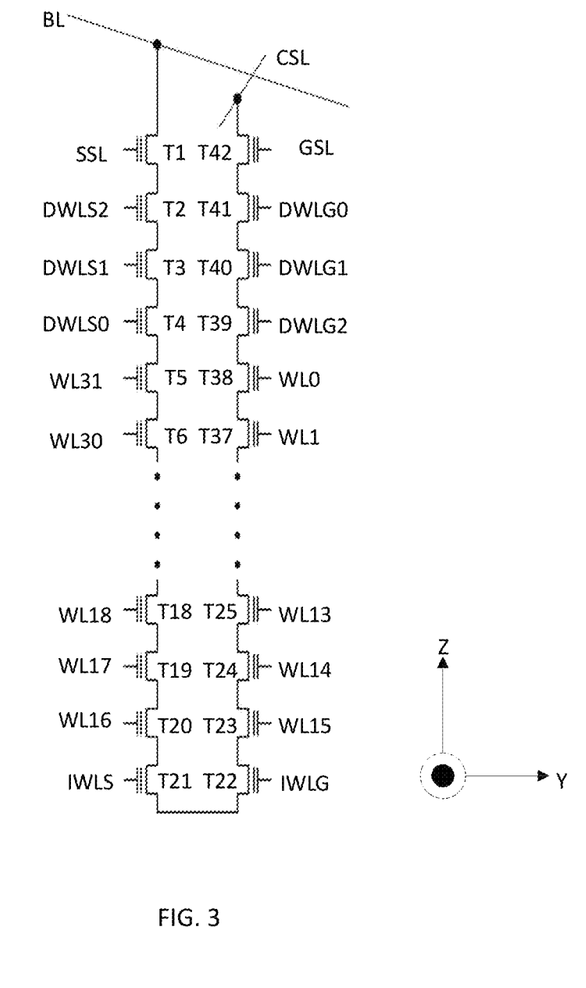
FIG. 3 illustrates an example circuit diagram for a memory cell array.

FIG. 3 illustrates an example circuit diagram for a memory cell array. In particular, FIG. 3 illustrates a circuit diagram for a string 310 of a memory cell array in the Y-Z plane. The memory cell array in FIG. 3 can be the memory cell array illustrated in FIG. 2. In FIG. 3, the memory cell array 300 includes a common source line CSL that extends in a first direction, e.g., in an X-X direction, and a bit line BL that extends in a second direction, e.g., in an Y-Y direction. In some implementations, the first direction can be perpendicular to the second direction. In some implementations, the first direction can be parallel to the second direction. In other implementations, the first direction can extend in any suitable direction relative to the second direction. The common source line CSL is connected to a plurality of memory cells along the X-X direction, and the bit line BL is connected to a plurality of memory cells along the Y-Y direction.

In some implementations, the common source line CSL and the bit line BL are provided in different metal layers. For example, referring to FIG. 2, the common source line CSL can be provided in the first metal layer ML1 and the bit line BL can be provided in the second metal layer ML2. In some implementations, the common source line CSL and the bit line BL can be provided in the same metal layer.

Referring back to FIG. 3, in a particular cell, the bit line BL is coupled to a plurality of transistors. For example, the bit line BL is coupled to the transistors T1-T21. The transistors T1-T21 can be implemented with various types of transistors including, but not limited to, a bipolar junction transistor, a p-channel Metal Oxide Semiconductor (PMOS) transistor, an n-channel Metal Oxide Semiconductor (NMOS) transistor, a complementary Metal Oxide Semiconductor (CMOS) transistor, or other types of transistors and memory cells. In some implementations, the transistors T1-T21 can be the same type of transistors. In some implementations, the transistor T1 coupled to the string select line SSL, the transistors T2-T4 coupled to the dummy word lines DWLS0-DWLS2, the transistors T5-T20 coupled to the word lines WL31-WL16, and the transistor T21 coupled to the inversion word line IWLS can be implemented using two or more types of transistors.

The transistor T1 is coupled to the string select line SSL. The source of the transistor T1 is coupled to the bit line BL, the gate of the transistor T1 is coupled to the string select line SSL, and the drain of the transistor T1 is coupled to the transistor T2. The transistor T1 is turned on or off based on the voltage provided through the string select line SSL. For example, when a voltage over a threshold level is provided to the gate of the transistor T1 through the string select line SSL, the transistor T1 is turned on so that current flows from the bit line BL to the transistor T2.

The transistors T2-T4 are coupled to dummy word lines DWLS2-DWLS0. The source of the transistor T2 is coupled to the drain of the transistor T1, the gate of the transistor T2 is coupled to the dummy word line DWLS2, and the drain of the transistor T2 is coupled to the transistor T3. The transistor T2 is turned on or off based on the voltage provided through the dummy word line DWLS2. For example, when a voltage over a threshold level is provided to the gate of the transistor T2 through the dummy word line DWLS2, the transistor T2 is turned on so that current flows from the transistor T1 to the transistor T3.

The source of the transistor T3 is coupled to the drain of the transistor T2, the gate of the transistor T3 is coupled to the dummy word line DWLS1, and the drain of the transistor T3 is coupled to the transistor T4. The transistor T3 is turned on or off based on the voltage provided through the dummy word line DWLS1. For example, when a voltage over a threshold level is provided to the gate of the transistor T3 through the dummy word line DWLS1, the transistor T3 is turned on so that current flows from the transistor T2 to the transistor T4. In some implementations, the transistors T2, T3 have a common gate. That is, the dummy word line DWLS2 and the dummy word line DWLS1 are connected to each other. In these implementations, the transistors T2, T3 can be simultaneously turned on or off based on the voltage applied to the common gate. In some implementations, the transistors T2, T3 can be inversely turned on or off, based on the voltage applied to the common gate, using one or more inverters coupled to the common gate.

The source of the transistor T4 is coupled to the drain of the transistor T3, the gate of the transistor T4 is coupled to the dummy word line DWLS0, and the drain of the transistor T4 is coupled to the transistor T5. The transistor T4 is turned on or off based on the voltage provided through the dummy word line DWLS0. For example, when a voltage over a threshold level is provided to the gate of the transistor T4 through the dummy word line DWLS0, the transistor T4 is turned on so that current flows from the transistor T3 to the transistor T5.

The transistors T5-T20 are respectively coupled to the word lines WL31-WL16. The gate of each transistor of the transistors T5-T20 is coupled to a respective word line of the word lines WL31-WL16. Each transistor of the transistors T5-T20 is turned on or off based on the voltage provided through the respective word line of the word lines WL31-WL16. For example, when a voltage over a threshold level is provided to the gate of the transistor of the transistors T5-T20 through the respective word line, the transistor is turned on so that current flows through the transistor. Each of the word lines WL31-16 is coupled to a plurality of memory cells.

The transistor T21 is coupled to the inversion word line IWLS. The gate of the transistor T21 is coupled to the inversion word line IWLS. The transistor T21 is turned on or off based on the voltage provided through the inversion word line IWLS. For example, when a voltage over a threshold level is provided to the gate of the transistor T21 through the inversion word line IWLS, the transistor T21 is turned on so that current flows from the transistor T20 to the transistor T22.

The source of the transistor T22 is coupled to the drain of the transistor T21. In addition, the transistor T22 is coupled to the inversion word line IWLG. The gate of the transistor T22 is coupled to the inversion word line IWLG. The transistor T22 is turned on or off based on the voltage provided through the inversion word line IWLG. For example, when a voltage over a threshold level is provided to the gate of the transistor T22 through the inversion word line IWLG, the transistor T22 is turned on so that current flows from the transistor T21 to the transistor T23.

In some implementations, the transistors T21, T22 are driven by a common driver. That is, the same voltage is applied to the gates of the transistors T21, T22 through the inversion word line IWLS and the inversion word line IWLG. In these implementations, the transistors T21, T22 can be simultaneously turned on or off based on the voltage applied to the gates of the transistors T21, T22. For example, when a voltage over a threshold is provided by the common driver to the gates of the transistors T21, T22, the transistors T21, T22 can be turned on together at the same time so that current can flow from the transistor T20 coupled to the word line WL16 to the transistor T23 coupled to the word line WL15. In some implementations, the transistors T21, T22 can be inversely turned on or off based on the voltage applied to the gates of the transistors T21, T22 using one or more inverters coupled to the gates.

The transistors T23-T38 are respectively coupled to the word lines WL15-WL0. In particular, the gate of each transistor of the transistors T23-T38 is coupled to a respective word line of the word lines WL15-WL0. Each transistor of the transistors T23-T38 is turned on or off based on the voltage provided through the respective word line of the word lines WL15-WL0. For example, when a voltage over a threshold level is provided to the gate of the transistor of the transistors T23-T38 through the respective word line, the transistor is turned on so that current flows through the transistor. Each of the word lines WL15-WL0 is coupled to a plurality of memory cells.

The transistors T39-T41 are respectively coupled to dummy word lines DWLG2-DWLG0. The source of the transistor T39 is coupled to the drain of the transistor T38, the gate of the transistor T39 is coupled to the dummy word line DWLG2, and the drain of the transistor T39 is coupled to the transistor T40. The transistor T39 is turned on or off based on the voltage provided through the dummy word line DWLG2. For example, when a voltage over a threshold level is provided to the gate of the transistor T39 through the dummy word line DWLG2, the transistor T39 is turned on so that current flows from the transistor T38 to the transistor T40.

In some implementations, the transistors T39, T4 have a common gate. That is, the dummy word line DWLG2 and the dummy word line DWLS0 are connected to each other. In these implementations, the transistors T39, T4 can be simultaneously turned on or off based on the voltage applied to the common gate. In some implementations, the transistors T39, T4 can be inversely turned on or off based on the voltage applied to the common gate using one or more inverters coupled to the common gate.

The source of the transistor T40 is coupled to the drain of the transistor T39, the gate of the transistor T40 is coupled to the dummy word line DWLG1, and the drain of the transistor T40 is coupled to the transistor T41. The transistor T40 is turned on or off based on the voltage provided through the dummy word line DWLG1. For example, when a voltage over a threshold level is provided to the gate of the transistor T40 through the dummy word line DWLG1, the transistor T40 is turned on so that current flows from the transistor T39 to the transistor T41.

The source of the transistor T41 is coupled to the drain of the transistor T40, the gate of the transistor T41 is coupled to the dummy word line DWLG0, and the drain of the transistor T41 is coupled to the transistor T42. The transistor T41 is turned on or off based on the voltage provided through the dummy word line DWLG0. For example, when a voltage over a threshold level is provided to the gate of the transistor T41 through the dummy word line DWLG0, the transistor T41 is turned on so that current flows from the transistor T40 to the transistor T42. In some implementations, the transistors T40, T41 have a common gate. That is, the dummy word line DWLG1 and the dummy word line DWLG0 are connected to each other. In these implementations, the transistors T40, T41 can be simultaneously turned on or off based on the voltage applied to the common gate. In some implementations, the transistors T40, T41 can be inversely turned on or off, based on the voltage applied to the common gate, using one or more inverters coupled to the common gate.

The transistor T42 is coupled to the ground select line GSL. The source of the transistor T42 is coupled to the drain of the transistor T41, the gate of the transistor T42 is coupled to the ground select line GSL, and the drain of the transistor T42 is coupled to the common source line CSL. The transistor T42 is turned on or off based on the voltage provided through the ground select line GSL. For example, when a voltage over a threshold level is provided to the gate of the transistor T42 through the ground select line GSL, the transistor T42 is turned on so that current flows from the transistor T41 to the common source line CSL.

The common source line CSL is coupled to a plurality of transistors T22-T42 as described above. The transistors T22-T42 can be implemented with various kinds of transistors including, but not limited to, a bipolar junction transistor, a PMOS transistor, a NMOS transistor, a CMOS transistor, or other types of transistors and memory cells. In some implementations, the transistors T22-T42 can be the same type of transistors. In some implementations, the transistor T42 coupled to the ground select line GSL, the transistors T39-T41 coupled to the dummy word lines DWLG2-DWLG0, the transistors T23-T38 coupled to the word lines WL15-WL0, and the transistor T22 coupled to the inversion word line IWLG can be implemented using two or more types of transistors.

Figure 4:
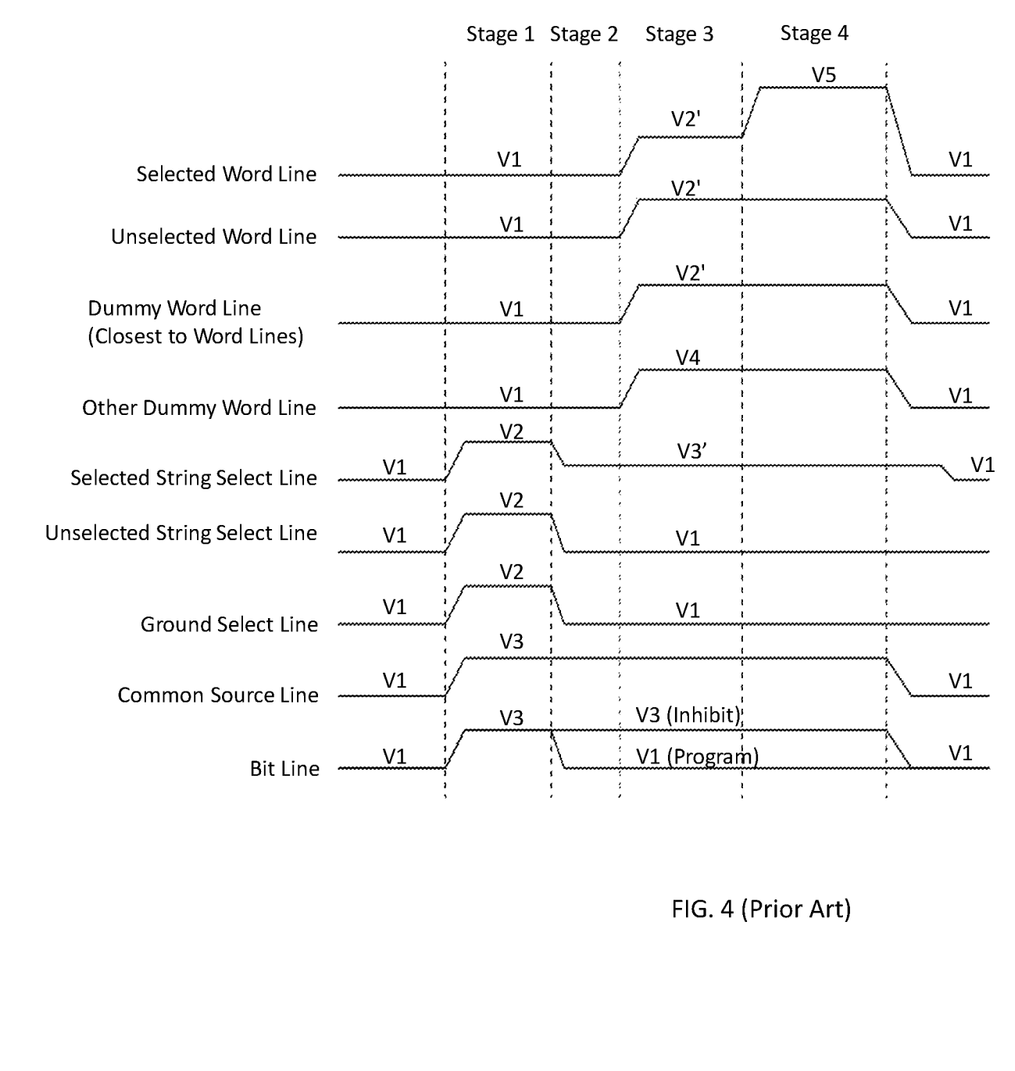
FIG. 4 illustrates an example prior art timing diagram to program data to one or more memory cells in a memory cell array.

FIG. 4 illustrates an example timing diagram to program data to one or more memory cells in a memory cell array. For convenience, the timing diagram will be described with respect to a memory controller that programs memory cells in a memory cell array using the timing diagram. For example, the memory controller 102 in FIG. 1 can program memory cells in the memory cell array 104 in FIG. 1 based on the timing diagram.

The timing diagram represents one programming cycle for programming data to one or more memory cells in a memory cell array. The programming cycle can include multiple stages. For example, the programming cycle can include four stages to program data to memory cells. The programming cycle can include a first stage, e.g., a bit line setup stage, a second stage, e.g., a string select line off stage, a third stage, e.g., $V_{PASS}$ setup state, and a fourth stage, e.g., $V_{PGM}$ setup stage. The stages can be performed sequentially in the stated order.

In FIG. 4, for convenience, it is assumed that transistors coupled to word lines, dummy word lines, string select lines, ground select lines, common source lines, and bit lines have the same threshold voltage $V_t$ to turn on the transistors. In addition, the memory controller is configured to apply a selected one of different voltage levels to various lines in the memory cell array: a voltage level $V_1$, a voltage level $V_2$, a voltage level $V_2'$, a voltage level $V_3$, a voltage level $V_3'$, a voltage level $V_3''$, a voltage level $V_4$, and a voltage level $V_5$.

In this example, the voltage level $V_5$ is higher than the voltage level $V_2$, the voltage level $V_2$ is higher than the voltage level $V_4$, the voltage level $V_4$ is higher than the voltage level $V_3$, and the voltage level $V_3$ is higher than the voltage level $V_1$. In some implementations, the voltage level $V_2'$ can be the same as the voltage level $V_2$. In some implementations, the voltage level $V_2'$ can be different from the voltage level $V_2$. In some implementations, the voltage level $V_3'$ can be the same as the voltage level $V_3$. In some implementations, the voltage level $V_3'$ can be different from the voltage level $V_3$. In some implementations, the voltage level $V_3''$ can be the same as the voltage level $V_3$. In some implementations, the voltage level $V_3''$ can be different from the voltage level $V_3$. Moreover, the threshold voltage $V_t$ is higher than the voltage level $V_1$ and lower than other voltage levels $V_2$-$V_5$. Since the threshold voltage $V_t$ is higher than the voltage level $V_1$, when the voltage level $V_1$ is applied to a transistor in the memory cell array, the transistor is not turned on. On the other hand, since the threshold voltage $V_t$ is lower than other voltage levels $V_2$-$V_5$, when any voltage level of the voltage levels $V_2$-$V_5$ is applied to a transistor in the memory cell array, the transistor is turned on. An example value of the voltage level $V_1$ is 0V, an example range of the voltage level $V_2$ is 6-10V, an example range of the voltage level $V_2'$ is 6-10V, an example range of the voltage level $V_3$ is 2-5V, an example range of the voltage level $V_3'$ is 2-5V, an example range of the voltage level $V_3'$ is 2-5V, an example range of the voltage level $V_4$ is 3-6V, an example range of the voltage level $V_5$ is 13-25V, and an example range of the threshold voltage $V_t$ is 0-2V.

In some implementations, different types of transistors can be used for word lines, dummy word lines, string select lines, ground select lines, common source lines, and bit lines. In these implementations, different transistors can have different threshold voltages. In this case, the voltages applied to the different transistors can be selected appropriately to turn the transistor on or off using the timing discussed below.

The first stage of the programming cycle can be a set up stage. In particular, the memory controller can set up one or more bit lines to program one or more memory cells. During the first stage of the programming cycle, the memory controller selects a string of the memory cell array, e.g., the string 310 of the memory cell array described with reference to FIG. 3. The memory controller applies voltage to the word lines, the unselected word lines, and the dummy word lines that turns off the transistors connected to these lines, and applies voltage to the string select lines, ground select lines, common source lines, and bit lines that turns on the transistors connected to these lines. In some implementations, the memory controller maintains the first stage for 5-15 μs.

With reference to FIG. 3, during the first stage of the programming cycle, the memory controller provides the voltage level $V_1$ to the word lines WL0-WL31 including selected word lines and unselected word lines. Since the voltage level $V_1$ is lower than the threshold voltage level $V_t$, the transistors T38-T5 coupled to the word lines WL0-WL31 are turned off during the first stage.

The memory controller selects the string 310 to program one or more memory cells in the string 310. The memory controller provides the voltage level $V_3$ to the bit line BL and the common source line CSL. In some implementations, the memory controller can provide the voltage level $V_3$ as an initial inhibit voltage for all memory cells within a block of the memory cell array. In some implementations, the memory controller can provide the voltage level $V_3$ as an initial inhibit voltage for one or more particular memory cells within a block of the memory cell array.

The memory controller provides the voltage level $V_2$ to the string select line SSL and the ground select line GSL. Since the voltage level $V_2$ is higher than the threshold voltage level $V_t$, the transistor T1 coupled to the string select line SSL is turned on to pass potential provided from the bit line BL to the channel of the string 310. Thus, the initial inhibit voltage, e.g., the voltage level $V_3$, provided from the bit line BL can be provided to the channel of the string 310 through the dummy word lines DWLS2-DWLS0.

The memory controller provides the voltage level $V_1$ to the dummy word lines DWLS2-DWLS0. If the voltage level $V_1$ is lower than the threshold voltage $V_t$ of the transistors T2-T4, the transistors T2-T4 are turned off. Thus, the potential provided from the bit line BL through the string select line SSL cannot pass through the transistors T2-T4 such that channel potential of the string 310 is not high enough to avoid program disturbance, which can result in a bad channel inhibition property.

Referring back to FIG. 4, the second stage of the programming cycle can be a string select line off stage. In particular, the memory controller can select or unselect particular string select lines to enable programming. During the second stage of the programming cycle, the memory controller keeps maintaining the voltage level $V_1$ at the word lines and the dummy word lines and the voltage level $V_3$ at the common source lines. For the selected string select lines, the memory controller changes the voltage from the voltage level $V_2$ to a voltage level $V_3'$. In some implementations, the voltage level $V_3'$ can be the same as the voltage level $V_3$. In some implementations, the voltage level $V_3'$ can be different from the voltage level $V_3$. In this example, the voltage level $V_3'$ can be higher than the threshold voltage $V_t$, but lower than the voltage level $V_2$. Thus, even after dropping the voltage from the voltage level $V_2$ to the voltage level $V_3'$, transistors coupled to the selected string select lines are turned on. For the ground select lines, the memory controller changes the voltage from the voltage level $V_2$ to the voltage level $V_1$. For the bit lines, the memory controller (i) keeps maintaining the voltage at the voltage level $V_3$ if the bit lines are coupled to memory cells that will be inhibited from programming and (ii) changes the voltage from the voltage level $V_3$ to the voltage level $V_1$ if the bit lines are coupled to memory cells that will be programmed.

With reference to FIG. 3, the memory controller provides the voltage level $V_3'$ to the selected string select line SSL and the voltage level $V_1$ to the ground select line GSL so that the transistor T1 is turned on and the transistor T42 is turned off. Since the transistor T1 is turned on, charges can be provided from the bit line BL to the string 310 through the string select line SSL. In addition, since the transistor T42 is turned off, charges can be accumulated in the channel of the string 310 so that the channel potential can be increased. Thus, programming is enabled. In some implementations, the memory controller maintains the second stage for 3-10 μs.

Referring back to FIG. 4, the third stage of the programming cycle can be a programming preparation stage. In particular, the memory controller begins applying a certain voltage to word lines before applying a program voltage. During the third stage of the programming cycle, the memory controller increases (i) the voltage at the selected word lines, the unselected word lines, and the dummy word line that is the closest to the word lines from the voltage level $V_1$ to the voltage level $V_2'$ and (ii) the voltage at other word lines from the voltage level $V_1$ to the voltage level $V_4$. In some implementations, the voltage level $V_2'$ can be the same as the voltage level $V_2$. In some implementations, the voltage level $V_2'$ can be different from the voltage level $V_2$. In some implementations, the memory controller maintains the third stage for 5-15 μs.

With reference to FIG. 3, the memory controller keeps providing the voltage level $V_3'$ to the string select line SSL and the voltage level $V_1$ to the ground select line GSL. Thus, programming is enabled. To program one or more memory cells in the string 310, the memory controller provides the voltage level $V_1$ to the bit line BL such that the bit line BL ties the channel of the string 310 to the voltage level $V_1$. When a program voltage is applied to the one or more memory cells to be programmed, e.g., a program voltage is applied to gates of the one or more memory cells to be programmed, the difference of potential between the gates and the channel causes tunneling effect, programming the one or more memory cells.

To inhibit programming to one or more memory cells in the string 310, the memory controller provides the voltage level $V_3$ to the bit line BL such that the bit line BL ties the channel of the string 310 to the voltage level $V_3$. Thus, even if a program voltage is applied to the one or more memory cells to be programmed, e.g., a program voltage is applied to gates of the one or more memory cells to be programmed, the difference of potential between the gates and the channel is not large enough to cause tunneling effect, inhibiting programming the one or more memory cells.

Referring back to FIG. 4, the fourth stage of the programming cycle can be a program stage. In particular, the memory controller applies a program voltage to selected word lines. During the fourth stage of the programming cycle, the memory controller increases the voltage at the selected word lines from the voltage level $V_2'$ to the voltage level $V_5$. The memory controller programs memory cells coupled to the selected word lines using the voltage level $V_5$. For the unselected word lines, the dummy word lines, the string select lines, the ground select lines, the common source lines, and the bit lines, the memory controller keeps maintaining the respective voltage at the third stage during the fourth stage. To program data to the memory cells securely, the memory controller maintains the voltage level $V_5$ for a particular time period. For example, the memory controller can apply the voltage level $V_5$ to the selected word lines for 10-100 μs. Once the particular time period lapses, the programming cycle is completed and the memory controller decreases the voltage for all the lines in the memory cell array to the voltage level $V_1$.

As described above, during the first stage or the second stage, the voltage level $V_1$ is provided to the dummy word lines. Since the voltage level $V_1$ is lower than the threshold voltage $V_t$, transistors coupled to the dummy word lines are turned off. For example, referring to FIG. 3, the dummy word lines DWLS2-DWLS0 are coupled between the string select line SSL and the word lines WL31-WL16. Where the dummy word lines DWLS2-DWLS0 are turned off, even if a high voltage is applied to the bit line BL, the high voltage cannot pass the dummy word lines DWLS2-DWLS0. That is, the high voltage cannot be transferred to the channel of the string 310. Thus, the channel potential of the string 310 is not high enough to avoid program disturbance, resulting in a poor channel inhibition property. The implementations in FIGS. 5 and 6 reduce or prevent program disturbance by applying a voltage that is higher than the threshold voltage $V_t$ to the dummy word lines during the first stage or the second stage of the programming cycle.

Figure 5:
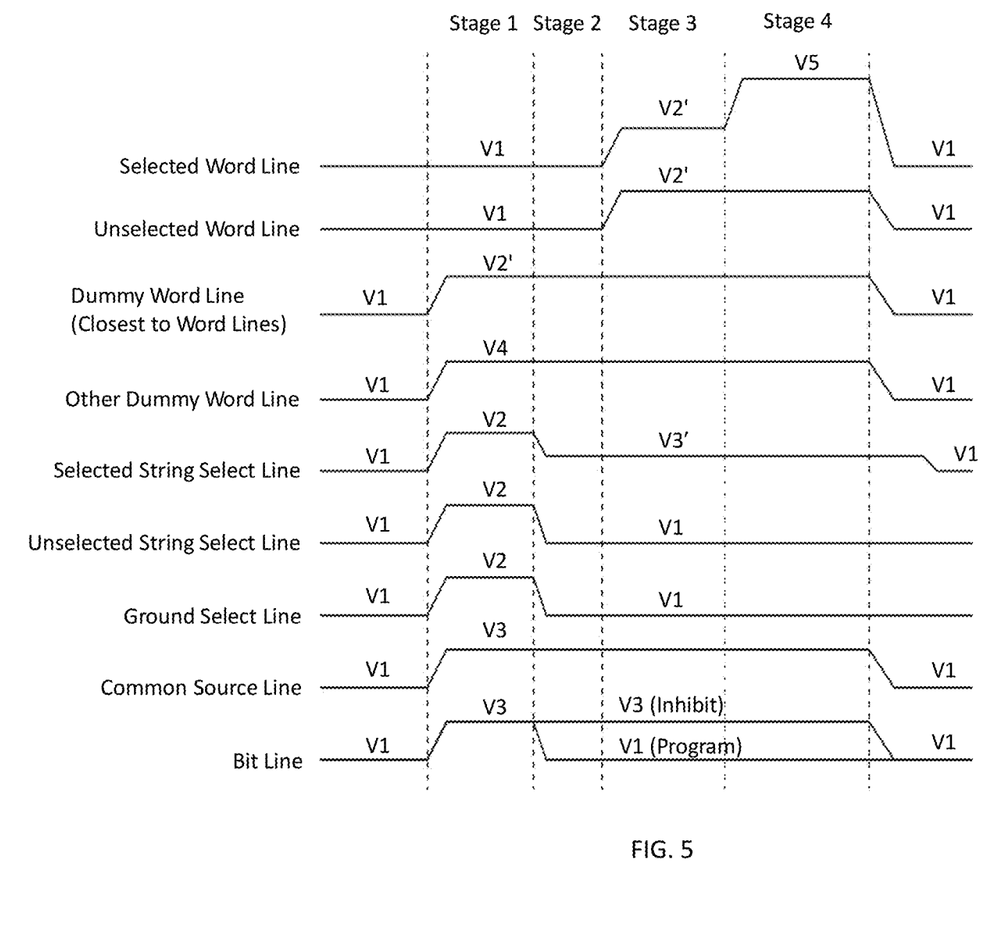
FIG. 5 illustrates another example timing diagram to program data to one or more memory cells in a memory cell array.

FIG. 5 illustrates another example timing diagram to program data to one or more memory cells in a memory cell array. For convenience, the timing diagram will be described with respect to a memory controller that programs memory cells in a memory cell array using the timing diagram. For example, the memory controller 102 in FIG. 1 can program memory cells in the memory cell array 104 in FIG. 1 based on the timing diagram.

The timing diagram in FIG. 5 is the same as the timing diagram in FIG. 4 except the following differences.

In the example described with reference to FIG. 4, during the first stage and the second stage of the programming cycle, the memory controller provides the voltage level $V_1$ to dummy word lines. In this example with reference to FIG. 5, during the first stage and the second stage of the programming cycle, the memory controller provides the voltage level $V_2'$ to the dummy word line that is the closest to the word lines and the voltage level $V_4$ to other dummy word lines. By providing the voltage level $V_2'$ and the voltage level $V_4$ that are higher than the threshold voltage $V_t$ to the dummy word lines, the transistors coupled to the dummy word lines are turned on such that the transistors can pass potential provided from a bit line to a channel of a string in the memory cell array.

For example, referring to FIG. 3, the memory controller provides the voltage level $V_4$ to the dummy word lines DWLS2-DWLS1 and the voltage level $V_2'$ to the dummy word line DWLS0. Since the voltage level $V_4$ and the voltage level $V_2'$ are higher than the threshold voltage $V_t$ of the transistors T2-T4, the transistors T2-T4 are turned on. Thus, the potential provided from the bit line BL can be transferred to the channel of the string 310 through the transistors T2-T4 such that channel potential of the string 310 is high enough to avoid program disturbance, improving the channel inhibition property.

Referring back to FIG. 5, it is illustrated that the voltage level $V_2'$ is applied to the gate of the transistor that is coupled to the dummy word line that is the closest to the word lines. However, the voltage applied to the gate of the transistor is not limited to the voltage level $V_2'$. Any suitable level of voltage that is higher than the threshold voltage $V_t$ can be applied to the gate of the transistor. In addition, in FIG. 5, it is illustrated that the voltage level $V_2'$ is applied to the dummy word line that is the closest to the word lines and the voltage level $V_4$ is applied to other dummy word lines. In some implementations, the voltage level $V_2'$ and the voltage level $V_4$ can have a different value as described above. In some other implementations, the voltage level $V_2'$ and the voltage level $V_4$ can have the same value.

In some implementations, the memory controller provides the voltage level $V_2'$ to the dummy word line that is the closest to the word lines for a particular time period. To prevent program disturbance effectively by fully passing the potential provided from the bit line to the channel of the string 310 with a large load, the memory controller can provide the voltage level $V_2'$ to the dummy word line that is the closest to the word lines for 10-100 μs.

Although the implementation described with reference to FIG. 5 improves the channel inhibition property, this implementation can cause a hot carrier disturbance. For example, referring to FIG. 3, during the first stage of the programming cycle, where the voltage level $V_2'$ is applied to the dummy word line DWLS0, which is the closest dummy word line to the word lines WL31-WL16, the transistor T4 coupled to the dummy word line DWLS0 is turned on. As a result, the transistor T4 can transfer the potential provided from the bit line BL to a drain of the transistor T4. Since the drain of the transistor T4 is coupled to a source of the transistor T5, the source of the transistor T5 is charged with a high voltage. However, during the first stage, where the voltage level $V_1$ is applied to the word line WL31, the transistor T5 coupled to the word line WL31 is turned off. The transistor T5 does not transfer the high voltage at the source of the transistor T5 to a drain of the transistor T5 so that the drain of the transistor T5 has a low voltage, e.g., ground. The voltage difference between the source of the transistor T5 and the drain of the transistor T5 can cause hot carrier disturbances. The implementation in FIG. 6 reduces or prevents the hot carrier disturbances by providing a two-step voltage, during the programming cycle, to the dummy word line that is the closest to the word lines.

Figure 6:
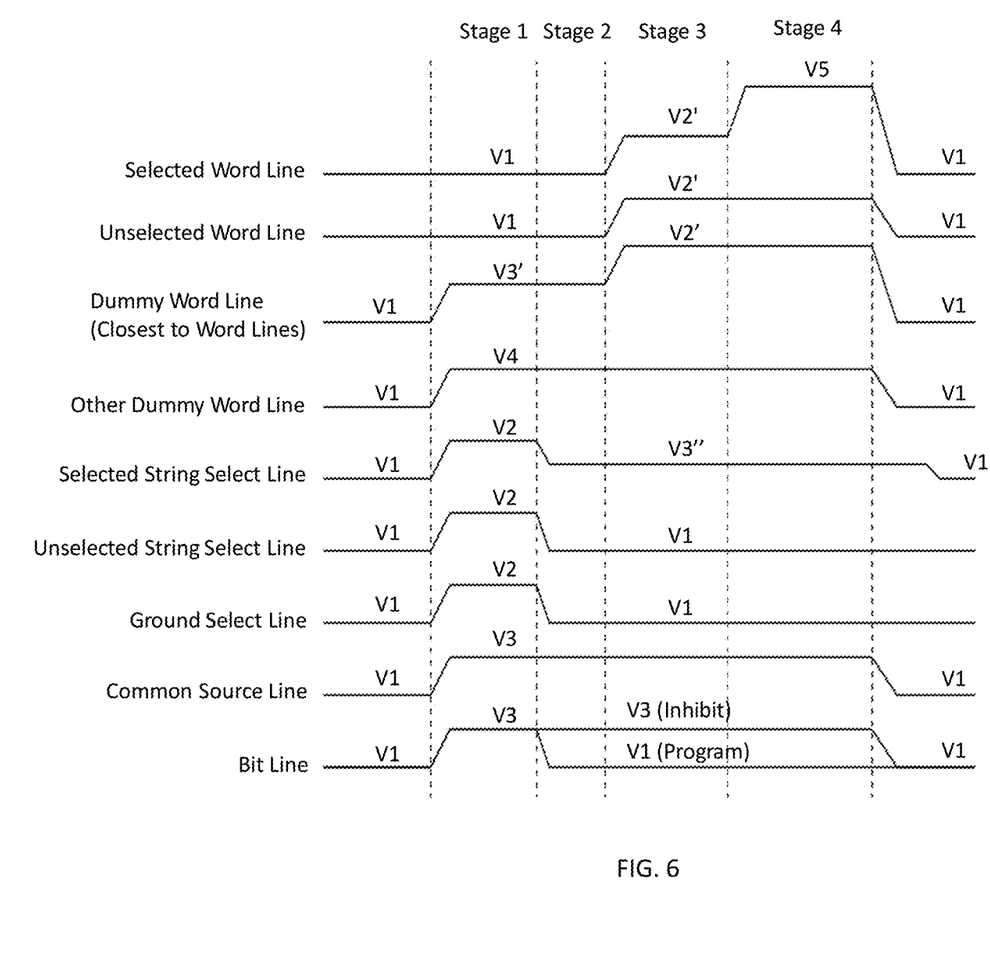
FIG. 6 illustrates another example timing diagram to program data to one or more memory cells in a memory cell array.

FIG. 6 illustrates another example timing diagram to program data to one or more memory cells in a memory cell array. For convenience, the timing diagram will be described with respect to a memory controller that programs memory cells in a memory cell array using the timing diagram. For example, the memory controller 102 in FIG. 1 can program memory cells in the memory cell array 104 in FIG. 1 based on the timing diagram.

The timing diagram in FIG. 6 is the same as the timing diagram in FIG. 4 except the following differences.

In the example described with reference to FIG. 4, during the first stage and the second stage of the programming cycle, the memory controller provides the voltage level $V_1$ to dummy word lines. In this example with reference to FIG. 6, during the first stage and the second stage of the programming cycle, the memory controller provides the voltage level $V_3'$ to the dummy word line that is the closest to the word lines and the voltage level $V_4$ to other dummy word lines. By providing the voltage level $V_3'$ and the voltage level $V_4$ that are higher than the threshold voltage $V_t$ to the dummy word lines, the transistors coupled to the dummy word lines are turned on such that the transistors can pass potential provided from a bit line to a channel of a string in the memory cell array.

For example, referring to FIG. 3, the memory controller provides the voltage level $V_4$ to the dummy word lines DWLS2-DWLS1 and the voltage level $V_3'$ to the dummy word line DWLS0. Since the voltage level $V_4$ and the voltage level $V_3'$ are higher than the threshold voltage $V_t$ of the transistors T2-T4, the transistors T2-T4 are turned on. Thus, the potential provided from the bit line BL through the string select line SSL can pass through the transistors T2-T4 such that channel potential of the string 310 is high enough to avoid program disturbance, improving channel inhibition property.

Moreover, the memory controller described with reference to FIG. 5 provides, to the dummy word line DWLS0 that is the closest to the word lines WL31-WL16, the voltage level $V_2'$ during the first stage and the second stage of the programming cycle. However, the memory controller described with reference to FIG. 6 provides, to the dummy word line DWLS0, the voltage level $V_3'$ during the first stage and the second stage. Since the voltage level $V_3'$ is lower than the voltage level $V_2'$, the voltage difference between the source of the transistor T5 and the drain of the transistor T5 can be reduced, preventing the hot carrier disturbances.

Referring back to FIG. 6, during the third stage and the fourth stage, the memory controller (i) increases the voltage at the dummy word line that is the closest to the word lines from the voltage level $V_3'$ to the voltage level $V_2'$ and (ii) maintains the voltage level $V_4$ at other dummy word lines.

In some implementations, the voltage level applied to the dummy word line that is closest to the word lines is not limited to the voltage level $V_3'$. Any suitable level of voltage that is higher than the threshold voltage $V_t$ can be applied to the dummy word line. In addition, in FIG. 6, it is illustrated that the voltage level $V_3'$ is applied to the dummy word line that is the closest to the word lines and the voltage level $V_4$ is applied to other dummy word lines. In some implementations, the voltage level $V_3'$ and the voltage level $V_4$ can have a different value as described above. In some other implementations, the voltage level $V_3'$ and the voltage level $V_4$ can have the same value.

The memory controller provides the voltage level $V_3''$ to the selected string select lines during the second stage, the third stage, and the fourth stage. In some implementations, the voltage level $V_3''$ can be lower than the voltage level $V_2$. In some implementations, the voltage level $V_3''$ can be the same as the voltage level $V_3'$. In some other implementations, the voltage level $V_3''$ can be different from the voltage level $V_3'$.

Figure 7:
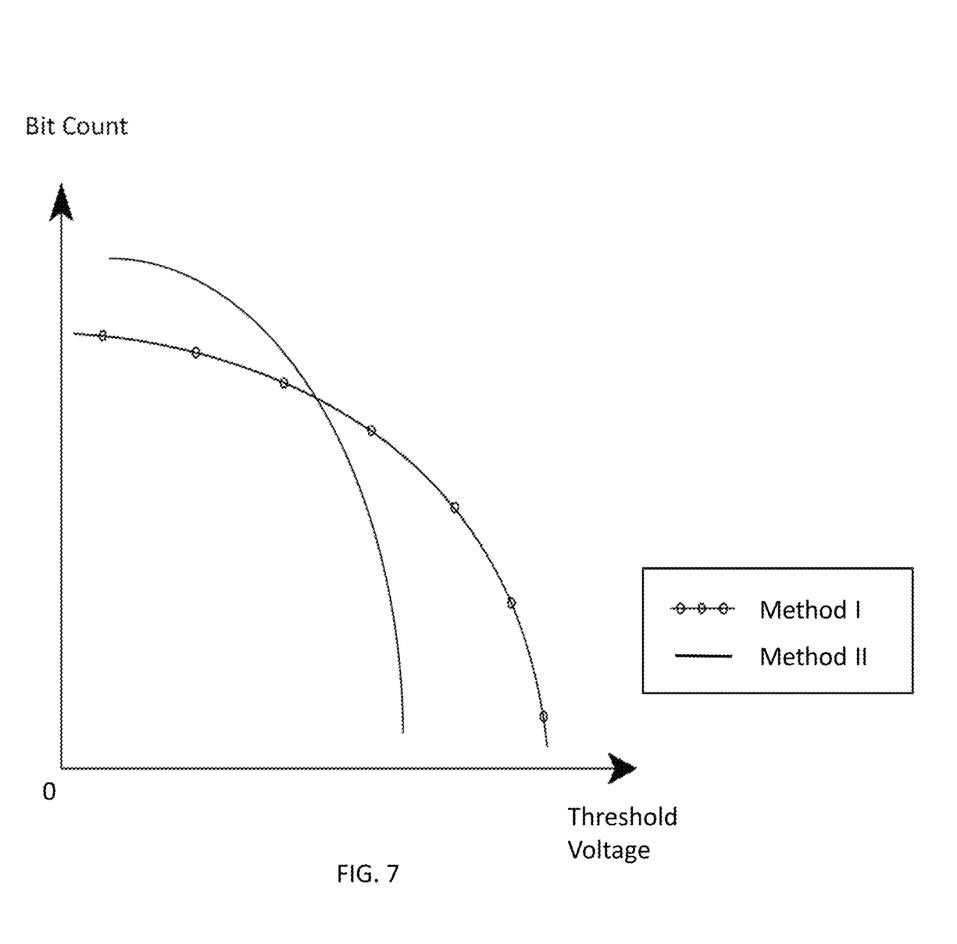
FIG. 7 illustrates an example graph showing threshold voltage versus bit count for programming data to memory cells that are located in a border area between dummy word lines and word lines.

FIG. 7 illustrates an example graph showing threshold voltage versus bit count for programming data to memory cells. Method I represents that the memory controller programs data to memory cells using the timing diagram in FIG. 5 and Method II represents that the memory controller programs data to memory cells using the timing diagrams in FIG. 6. The threshold voltage $V_t$ represents a threshold voltage of a transistor coupled to a dummy word line that is the closest to word lines.

As illustrated in FIG. 7, Method II is more efficient than Method I because there is less threshold voltage disturbance when Method II is used. As described with reference to FIG. 6, when Method II is used, hot carriers are suppressed by the voltage applied to the transistor coupled to the dummy word line that is the closest to word lines during the first stage and the second stage of the programming cycle. By suppressing the hot carriers, threshold voltage shift can be prevented such that there is less threshold voltage disturbance.

The disclosed and other examples can be implemented as one or more computer program products, for example, one or more modules of computer program operations encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive operations and data from a read only memory or a random access memory or both. The essential elements of a computer can include a processor for performing operations and one or more memory devices for storing operations and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program operations and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:
1. A memory device comprising:
a memory controller; and
a memory cell array that includes one or more memory blocks, wherein each memory block of the one or more memory blocks includes one or more strings, each string of the one or more strings comprising:
a plurality of dummy word lines,
a plurality of word lines, and
a plurality of memory cells respectively coupled to the plurality of word lines,
wherein the memory controller programs one or more data to one or more memory cells of the plurality of memory cells using operations during a programming cycle, the operations comprising:
during a setup stage of the programming cycle, providing a first voltage level to the plurality of word lines, providing a second voltage level to a first dummy word line of the plurality of dummy word lines, and providing a fourth voltage level to second dummy word lines of the plurality of dummy word lines, the second dummy word lines being different from the first dummy word line, wherein (i) the first voltage level is lower than a threshold voltage of a first transistor coupled to the first dummy word line and (ii) the second voltage level and the fourth voltage are higher than the threshold voltage of the first transistor, during a program stage of the programming cycle, providing a third voltage level to one or more first word lines of the plurality of word lines to program one or more data to one or more memory cells coupled to the one or more first word lines, providing the second voltage level to the first dummy word line of the plurality of dummy word lines, and providing the fourth voltage level to the second dummy word lines of the plurality of dummy word lines.

2. The memory device of claim 1, wherein the operations further comprises:

during the program stage of the programming cycle, providing a fifth voltage level to one or more second word lines of the plurality of word lines to maintain one or more data stored in one or more memory cells coupled to the one or more second word lines.

3. The memory device of claim 1, wherein the first dummy word line is a dummy word line from the plurality of dummy word lines that is closest to the plurality of word lines.

4. The memory device of claim 1, wherein the setup stage of the programming cycle continues for 1-10 µs.

5. The memory device of claim 1, wherein the program stage of the programming cycle continues for 10-100 µs.

6. The memory device of claim 2, wherein the third voltage level is between 13 and 25V and the fifth voltage level is between 6 and 10V.

7. The memory device of claim 1, wherein the second voltage level is between 6 and 10V.

8. The memory device of claim 2, wherein the second voltage level is the same as the fifth voltage level.

9. The memory device of claim 2, wherein the second voltage level is different from the fifth voltage level that is higher than the threshold voltage.

10. A method for programming, during a programming cycle, one or more data to a memory cell array that includes one or more memory blocks, wherein each memory block of the one or more memory blocks includes one or more strings, each string of the one or more strings comprising:

a plurality of dummy word lines, a plurality of word lines, and a plurality of memory cells respectively coupled to the plurality of word lines, wherein the method comprises:

during a setup stage of the programming cycle, providing a first voltage level to the plurality of word lines, providing a second voltage level to a first dummy word line of the plurality of dummy word lines, and providing a fourth voltage level to second dummy word lines of the plurality of dummy word lines, the second dummy word lines being different from the first dummy word line, wherein (i) the first voltage level is lower than a threshold voltage of a first transistor coupled to the first dummy word line and (ii) the second voltage level and the fourth voltage level are higher than the threshold voltage of the first transistor, during a program stage of the programming cycle, providing a third voltage level to one or more first word lines of the plurality of word lines to program one or more data to one or more memory cells coupled to the one or more first word lines, providing the second voltage level to the first dummy word line of the plurality of dummy word lines, and providing the fourth voltage level to the second dummy word lines.

11. The method of claim 10, further comprising:

during the program stage of the programming cycle, providing a fifth voltage level to one or more second word lines of the plurality of word lines to maintain one or more data stored in one or more memory cells coupled to the one or more second word lines.

12. The method of claim 10, wherein the first dummy word line is a dummy word line from the plurality of dummy word lines that is closest to the plurality of word lines.

13. The method of claim 10, wherein the setup stage of the programming cycle continues for 1-10 µs.

14. The method of claim 10, wherein the program stage of the programming cycle continues for 10-100 µs.

15. The method of claim 11, wherein the third voltage level is between 13 and 25V and the fifth voltage level is between 6 and 10V.

16. The method of claim 10, wherein the second voltage level is between 6 and 10V.

17. The method of claim 11, wherein the second voltage level is the same as the fifth voltage level.

18. The method of claim 11, wherein the second voltage level is different from the fifth voltage level that is higher than the threshold voltage.

19. A memory device comprising:

a memory controller; and a memory cell array that includes one or more memory blocks, wherein each memory block of the one or more memory blocks includes one or more strings, each string of the one or more strings comprising:

a plurality of dummy word lines, a plurality of word lines, and a plurality of memory cells respectively coupled to the plurality of word lines, wherein the memory controller is configured to program one or more data to one or more memory cells of the plurality of memory cells using operations during a programming cycle, the operations comprising:

during a setup stage of the programming cycle, providing a first voltage level to the plurality of word lines, providing a second voltage level to a first dummy word line of the plurality of dummy word lines, and providing a fourth voltage level to second dummy word lines of the plurality of dummy word lines, the second dummy word lines being different from the first dummy word line, wherein (i) the first voltage level is lower than a threshold voltage of a first transistor coupled to the first dummy word line and (ii) the second voltage level and the fourth voltage level are higher than the threshold voltage of the first transistor, during a program stage of the programming cycle, providing a third voltage level to one or more first word lines of the plurality of word lines to program one or more data to one or more memory cells coupled to the one or more first word lines, and providing a fifth voltage level to the first dummy word line of the plurality of dummy word lines, and providing the fourth voltage level to the second dummy word lines, wherein the fifth voltage level is higher than the second voltage level.

20. The memory device of claim 19, wherein the first dummy word line is a dummy word line from the plurality of dummy word lines that is closest to the plurality of word lines.

* * * * *